United States Patent
Gustafson et al.

(10) Patent No.: US 6,837,965 B2
(45) Date of Patent: Jan. 4, 2005

(54) METHOD AND APPARATUS FOR ETCH PROCESSING WITH END POINT DETECTION THEREOF

(76) Inventors: Aaron D. Gustafson, 9716 NW. 14th Ave., Vancouver, WA (US) 98665; Daniel J. Baer, 19130 Woods Rd., Vernonia, OR (US) 97064; Leonard D. Moravek, 1372 McPherson St., Santa Clara, CA (US) 95051; John P. Kettley, Jr., 13103 120th Ave., East Puyallup, WA (US) 98408

(*) Notice: Subject to any disclaimer, the term of this patent is extended or adjusted under 35 U.S.C. 154(b) by 118 days.

(21) Appl. No.: 10/219,888

(22) Filed: Aug. 14, 2002

(65) Prior Publication Data

US 2004/0087040 A1 May 6, 2004

(51) Int. Cl.[7] .................... H05H 1/00; C23C 16/00; H01L 21/00

(52) U.S. Cl. .................... 156/345.25; 118/712; 438/9
(58) Field of Search .................... 156/345.25, 345.24; 118/712, 728; 438/5, 9

(56) References Cited

U.S. PATENT DOCUMENTS

| | | | | |
|---|---|---|---|---|
| 5,622,593 A | * | 4/1997 | Arasawa et al. | 156/345.27 |
| 6,113,733 A | * | 9/2000 | Eriguchi et al. | 156/345.24 |
| 6,361,646 B1 | * | 3/2002 | Bibby et al. | 216/85 |
| 6,406,545 B2 | * | 6/2002 | Shoda et al. | 118/724 |

* cited by examiner

*Primary Examiner*—Parviz Hassanzadeh
(74) *Attorney, Agent, or Firm*—Moser, Patterson, Sheridan LLC; Joseph Bach

(57) ABSTRACT

A method and apparatus performing process end point detection in a semiconductor substrate processing system by monitoring for an increase in a flow of backside gas above a predetermined limit.

17 Claims, 4 Drawing Sheets

METHOD AND APPARATUS FOR ETCH PROCESSING WITH END POINT DETECTION THEREOF

BACKGROUND OF THE INVENTION

1. Field of the Invention

The present invention generally relates to semiconductor substrate processing systems. More specifically, the present invention relates to a method and apparatus for performing etch process end point detection in a semiconductor substrate processing system.

2. Description of the Related Art

During the manufacture of semiconductor devices, a deep trench plasma etch provides non-mechanical separation simultaneously for all chips on a substrate (also referred to herein as a wafer). Being a highly productive process, a deep trench plasma etch process has found wide use in semiconductor wafer processing systems.

The term "deep trench plasma etch" is broadly used to refer to processes used to manufacture devices on silicon and non-silicon substrates comprising a processing step that plasma etches through a bulk of material of the substrate.

A requirement in such processes is a prompt termination of etching immediately after the first through, or clear, opening has been developed in the substrate. Therefore, reliable and accurate end point detection is critical during deep trench plasma etch. However, during deep trench plasma etch, the conventional end point detectors do not operate reliably.

There are generally two classes of background art systems for end point detection used during plasma etching, both require at least one viewing port in the etch chamber. The first class of systems includes laser interferometric detectors. These detectors focus a laser on the material to be etched and monitor the phase of the light reflected from the material. As the material is etched (removed), the phase of the reflected light changes in proportion with the depth of the etch. In this manner, the detector monitors the etch depth and can cause the etching process to stop upon achieving a predetermined depth. To measure minute phase changes, the equipment must be accurately calibrated, and such equipment requires repeated recalibration. Also, as line widths become narrower, maintaining the laser focus upon a bottom of a trench is becoming difficult.

The second class of the systems includes optical emission spectrometry (OES) detectors. These detectors comprise a data acquisition system and a plasma optical emission receiver and detect a change in intensity of one or several wavelengths of the plasma optical emission related to an etched or underlying layer. Sensitivity of these detectors reduces with either complexity of spectrums or intensity of the plasma as the spectral lines of interest become obscured by background spectrum.

To identify the occurrence of a deep trench plasma etch extending through the wafer, the change in the spectrum that occurs when backside gas escapes into the chamber through the trench is detected. For example, during the etch process, a backside gas (e.g., helium) is provided to the interstitial spaces between the wafer and the pedestal to promote heat transfer. As such, the gas leaks into the chamber from the edges of the wafer throughout the process. Therefore, the plasma always contains some amount of the backside gas. Upon the trench etching through the substrate, a small amount of additional backside gas escapes through the trench into the chamber. This additional gas alters the emission spectrum of the plasma. The end point detector can monitor this spectral change and stop etching upon its detection. However, the spectral change is so small that it might be missed until the etching process forms a substantial opening. Because the spectral change is small, any plasma non-uniformity may mask the signal.

If the end point is missed during deep trench plasma etch, there is a risk of plasma damage to the substrate pedestal and a risk of contamination of the pedestal by sub-products of the etching process and contamination of an etch chamber by a material from the pedestal. In many plasma chambers, a portion of the pedestal supporting a substrate is an electrostatic chuck that can be damaged even by accidental exposure to plasma or by the contaminants arising from exposure to the plasma.

Therefore, a need exists in the art for reliable end point detection during deep trench plasma etch.

SUMMARY OF THE INVENTION

The present invention is a method and apparatus for determining the end point of a plasma process that uses an increase in a value of a flow of backside gas. In one embodiment of the invention, an increase in the flow of backside gas is detected after an opening in a substrate has been formed by a plasma etching process. The invention provides reliable and timely detection of the process end point.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method and apparatus for determining the end point of deep trench plasma etch process.

Figure 1:
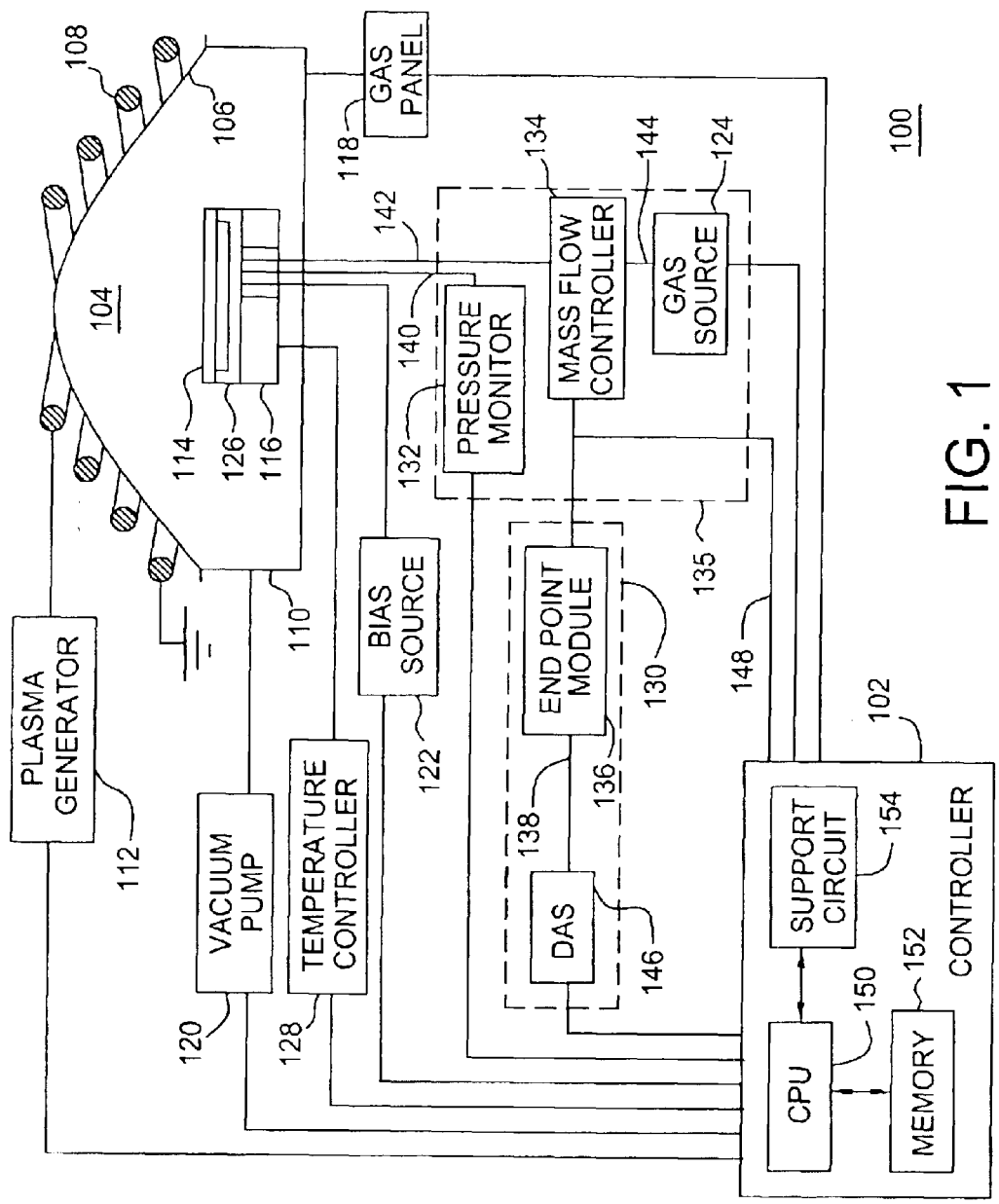
FIG. 1 is a schematic diagram of a semiconductor wafer processing system that can be used for deep trench plasma etch having an end point detection system in accordance with one embodiment of the present invention.

FIG. 1 is a schematic diagram of one embodiment of a semiconductor wafer processing system 100 generally comprising an etch processing chamber 104, an end point detector 130, and a computerized controller 102. The end point detector 130 comprises a data acquisition system (DAS) 146, an end point module 136, and an interface 138. The DAS 146 is similar to a DAS of a conventional OES detector used with a plasma optical emission receiver.

The controller 102 comprises a central processing unit (CPU) 150, a memory 152, and support circuit 154. The controller 102 is coupled to various components of the chamber 104 to facilitate control of the etch process. The controller 102 regulates and monitors processing in the chamber 104 via interfaces that can be broadly described as analog, digital, wired, wireless, optical, and fiber-optic interfaces. To facilitate control of the chamber as described above, the CPU 150 may be one of any form of general purpose computer processor that can be used in an industrial setting for controlling various chambers and sub-processors. The memory 152 is coupled to the CPU 150. The memory 152, or computer-readable medium, may be one or more of readily available memory such as random access memory (RAM), read only memory (ROM), floppy disk, hard disk, or any other form of digital storage, local or remote. The support circuits 154 are coupled to the CPU 150 for supporting the processor in a conventional manner. These circuits include cache, power supplies, clock circuits, input/output circuitry and subsystems, and the like.

An etching process is generally stored in the memory 152 as a software routine. The software routine may also be stored and/or executed by a second CPU (not shown) that is remotely located from the hardware being controlled by the CPU 150. The software routine, when executed by the CPU 150, transforms the general purpose computer into a specific purpose computer (controller) 102 that controls the chamber operation such that the deep trench plasma etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

The chamber 104 may be used for plasma-enhanced processes. Such processes include, but are not limited to: deep trench plasma etch, inductively coupled plasma (ICP) etch, pre-clean sputter etch, plasma enhanced chemical vapor deposition (PECVD), and related processes used to manufacture semiconductor devices, very large scale integration (VLSI) devices, computer and optical media, optoelectronics, micro-mechanical systems (MEMS), and the like.

The chamber 104 comprises an upper portion 106 (e.g., a roof or a dome), an antenna 108 coupled to plasma generator 112 (e.g., an RF power source), and a lower portion 110. The upper and lower portions are sealed to one another and, together, define a vacuum chamber. The lower portion 110 comprises a substrate pedestal 116, gas panel 118 to supply process gas, and vacuum pump 120 for providing a vacuum and evacuation of the used gases and volatile sub-products.

The pedestal 116 generally is coupled to a bias source 122, a backside gas system 135, a chuck 126 for retaining the substrate 114, and temperature controller 128 for establishing a process temperature the substrate 114. The backside gas system 135 comprises a gas source 124, a pressure monitor 132, a mass flow controller 134, and backside gas plumbing lines 140, 142, 144. The chuck 126 can be either an electrostatic chuck or a mechanical chuck mounted atop of the pedestal 116. The chuck 126 maintains the substrate 114 at a stationary location during substrate processing.

The gas source 124 contains a pressurized, high purity backside gas, which generally is an inert gas such as helium, argon, and the like or a combination thereof. The pressure monitor 132 measures the pressure of the backside gas in a space between a non-processed surface (i.e., the "backside") of the substrate 114 and a support surface of the chuck 126. In one embodiment of a chuck, the support surface contains grooves that are coupled to the backside gas line 140. The grooves form a pattern to facilitate uniform gas distribution beneath the substrate.

Backside gas serves as a heat transfer agent between the substrate 114 and the chuck 126. During deep trench plasma etching, the chuck 126 is cooled using coolant supplied by the temperature controller 128 to a temperature lower than that of the substrate 114 and, therefore, the backside gas assists in cooling the substrate 114.

During processing of the substrate 114, the controller 102 adjusts the flow of the backside gas using the monitor 136 to achieve and maintain a nominal pressure of the gas. The pressure typically is controlled in a range of 4–16 Torr and, in particular, in a range of 8–12 Torr. The range of 8–12 Torr generally facilitates the most efficient heat transfer between the substrate and the chuck. The controller 102 uses an interface 148 to the controller 134 to perform adjustments of the flow to achieve and maintain the nominal level of the pressure of the backside gas.

During the etch process, a nominal level of the flow of the backside gas, corresponding to the nominal gas pressure, is established in the system 100, and the flow rises when a punch through of the substrate 114 occurs. The flow controller 134 generates a voltage that is proportional to the gas flow through the flow controlled 134. This voltage is coupled to the end point detection system 130. When the voltage representing the flow exceeds a preset limit, the output signal of the end point module 136 exceeds a level defined for the end point event. The limit for the flow of the backside gas generally is established experimentally during characterization tests of deep trench plasma etch prior to processing the product substrates. The output signal of the module 136 is delivered by the interface 138 to the DAS 146.

In the present invention, the output signal of the module 136 is scaled to be a substitute for the optical end point signal otherwise produced by a plasma optical emission sensor. The module 136 operates as a voltage-to-optical signal converter. The signal from the flow controller 134 is converted by the module 136 into an optical signal. When the signal received from the module 136 becomes equal or greater than a predetermined limit, the DAS 146 defines the end point for the etch process and submits this information to the controller 102. In response, the controller 102 terminates the plasma, and deep trench plasma etch of the substrate 114 is stopped.

In one embodiment of the present invention, the DAS 146 and controller 102 utilize the same end point detection software that conventionally used to control a plasma. To reduce the electrical noise and increase electrical immunity between the module 136, the chamber 104, and the DAS 146, in one embodiment, the interface 138 is an optical cable, and, more specifically, a fiber-optic cable. The optical cable may be a conventional cable for optical emission monitoring used to couple the DAS to a window in the etch processing chamber. In one embodiment of the invention, the cable is removed from the window and connected to the output of the module 136. The DAS 146 receives the optical signal and converts the signal to an electrical format for further processing by the DAS 146 and the controller 102. As such, the module 136, the mass flow controller 134, and the DAS 146 do not have a direct electrical connection to one another, i.e., the module 136 operates as an optocoupler.

Figure 2:
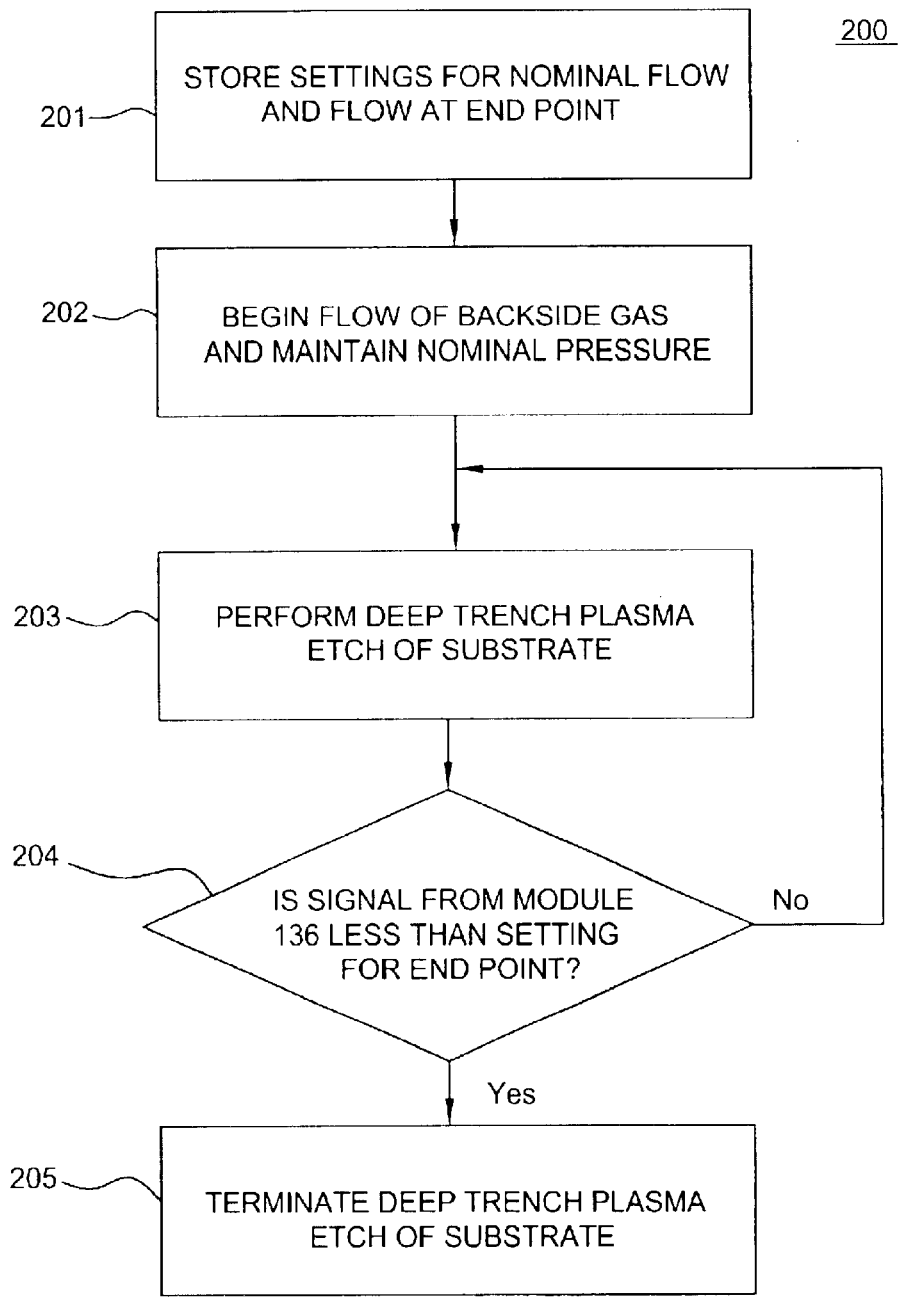
FIG. 2 is a flow diagram of a method of end point detection in accordance with one embodiment of the present invention.

FIG. 2 is a flow diagram for a method of end point detection in accordance with one embodiment of the present invention shown as a sequence 200. The sequence 200 comprises steps 201–205. At step 201, settings for a nominal flow of the backside gas and for a flow at the end point are stored in the memory 152. At step 202, a flow the backside gas begins and a controlled level of the backside gas pressure is reached and maintained. At step 203, a deep trench plasma etch process is performed upon the substrate 114. Step 204 is a decision step wherein the controller 102 defines whether the end point has been detected. An end point is detected (i.e., an end point event) when the module 136 produces a sufficiently large optical signal in response to an increase in the voltage representing the backside gas flow. If the end point event does not occur, the process 200 continues etching the substrate. At step 205, upon an end point event occurring, the deep trench plasma etch process is terminated in the chamber 104.

Figure 3:
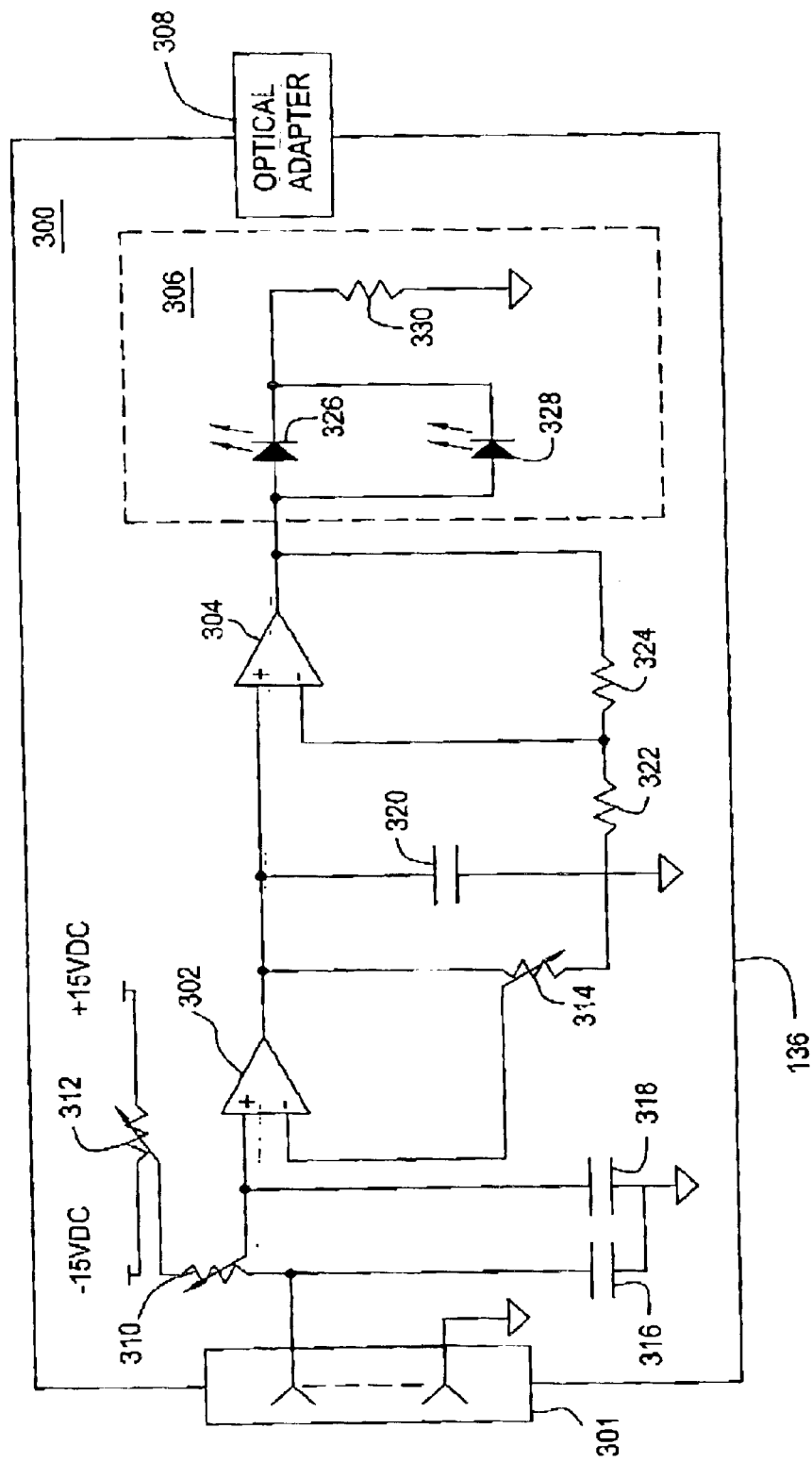
FIG. 3 is a schematic diagram of an end point module in accordance with one embodiment of the present invention.

FIG. 3 is a schematic diagram of the end point module 136 in accordance with one embodiment of the present invention (component pin numbers and power connections are not shown). The module 136 comprises a two-stage amplifier 300 having a first stage 302, a second stage 304, an optical output load 306, and an optical adapter 308. An input signal from the flow controller 134 is provided through an electrical connector 301. The first stage 302 comprises "Input Scaling" potentiometer 310, "Input Offset" potentiometer 312, "Input Gain" potentiometer 314, the input filtering capacitors 316, 318, and an output filtering capacitor 320. The stages 302 and 304 are generally operational amplifiers, specifically, operational amplifiers model Super 741. The nominal values of the potentiometers 310, 312, and 314 are about 20 kΩ, and the nominal values of the capacitors 316, 318 and 320 are about 0.1 μF. The second stage 304 comprises the gain setting resistors 322 and 324 having the nominal values of about 2 kΩ and 18 kΩ, respectively.

The optical output load 306 comprises a high intensity light emitting diode (LED) 326, a LED 328, and a current limiting resistor 330 having a value of about 540 Ω. The LED 326 emits a broad spectral range "Pure White" light, and the LED 328 emits a narrow spectral range "Ultra Blue" light. The wavelengths are selected to emulate the expected optical spectrum that is monitored by the DAS. For detecting the helium produced spectra, the LEDs produce at least blue light. Other detection spectra may be used to make the module 136 compatible with an existing DAS. Both LED are selected for the most efficient conversion of an electrical output signal from the second stage 304 into an optical signal. Although the depicted embodiment has two LEDs, other embodiments may use one LED or more than two.

The optical signal is coupled by the adapter 308 into an optical cable and transmitted to an optical input of the DAS 146. The adapter 308 performs coupling of the light emitted by the LED 326 and the LED 328 into the optical cable. The adapter 308 is generally an optical condenser. The optical cable is generally a fiber-optic cable. Intensity of light emitted by the LED 326 and the LED 328 depends highly non-linearly from an output voltage of the stage 304, sharply increasing with the output voltage. Voltage gain of the stage 302 is adjusted using the potentiometers 310, 312, and 314. Voltage gain of the stage 302 is set by the resistors 322 and 324. Combined gain of the stages 302 and 304 is adjusted in a manner that provides a peak of the emitted light (also referred to as an optical output) at about a level of the predetermined limit for a flow of the backside gas at the end point (i.e., at punch trough), thus increasing sensitivity of end point detection by the DAS 146.

Figure 4:
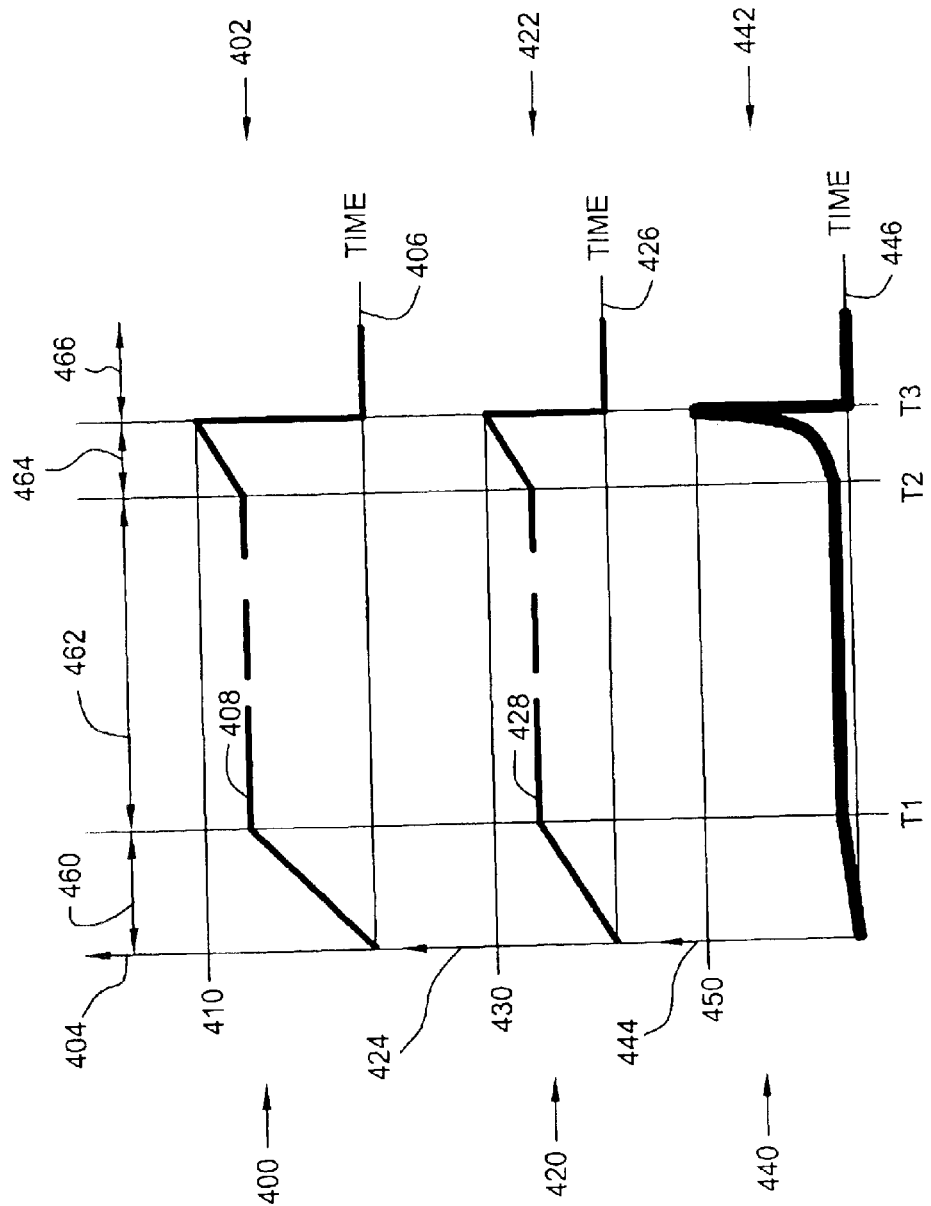
FIG. 4 is a timing diagram of flow and pressure of backside gas and an output signal of the end point module of FIG. 3 during a deep trench plasma etch process.

FIG. 4 depicts an exemplary timing diagram representing a method for determining an end point during a deep trench plasma etch process in accordance with the invention. Solid and dashed lines are used in the graphs of FIG. 4 to indicate the controlled and uncontrolled values, respectively. Specifically, shown in FIG. 4 is a graph 400 depicting a value of a flow 402 of the backside gas (axis 404) versus time (axis 406), a graph 420 depicting an electrical output signal 422 from the second stage 304 (axis 424) versus time (axis 426), and a graph 440 depicting an intensity of an optical output 442 (axis 444) of the module 136 versus time (axis 446).

As described with respect to FIG. 4, the flow of a backside gas begins during period 460. Next, as the plasma is ignited and maintained, the flow is stabilized by the moment T1 at a nominal level 408 during period 462. During period 464 starting at the moment T2, the backside gas flow increases as the plasma begins punching through the substrate. At the moment T3, the flow reaches a level 410 corresponding to an end point during deep trench plasma etch, and the flow and the plasma are terminated. Lastly, the flow of the backside gas stays terminated during period 466 until deep trench plasma etch of the next substrate begins. The signal 422 is proportional to the signal 402. The signal 422 reaches a level 428 and a level 430 at moments T1 and T3, respectively. The levels 428 and 430 of the signal 422 correspond to the levels 408 and 410 of the flow 402 at the moments T1 and T3, respectively. The optical output 442 stays at a low level 448 during period 462. However, as discussed above, specific adjustments of an electrical gain in the module 136 result in the optical output 442 having a sharp peak 450 at the moment T3 when a flow of the backside gas reaches the level 410 that set for a flow at the end point.

In one embodiment, the invention is used in the deep trench silicon etch chamber (known as a Decoupled Plasma Source (DPS) chamber) with a plasma processing system model Centura 5200, manufactured and sold by Applied Materials, Inc. of Santa Clara, Calif., USA. Other process chambers and systems that require sensitive end point detection will also find the invention useful.

While foregoing is directed to the preferred embodiment of the present invention, other and further embodiments of the invention may be devised without departing from the basic scope thereof, and the scope thereof is determined by the claims that follow.

What is claimed is:

1. Apparatus for processing a substrate on a support pedestal, comprising:
   an end point module for monitoring of a value of a flow of a backside gas into a space between the substrate and the support pedestal;
   an end point data acquisition system for determining an end point of a process when the value of said flow increases above a predetermined limit.

2. The apparatus of claim 1, wherein said data acquisition system produces a signal representing an end point of the process when the value of said flow increases above the predetermined limit.

3. The apparatus of claim 1, wherein the end point module is coupled to said data acquisition system by an optical cable.

4. The apparatus of claim 1, wherein said data acquisition system is coupled to a controller of a semiconductor substrate processing system.

5. The of claim 1, wherein the semiconductor substrate processing system is a deep trench plasma etch semiconductor substrate processing system.

6. The apparatus of claim 1, wherein the end point module is a controlled gain amplifier.

7. The apparatus of claim 6, wherein the controlled gain amplifier comprises a first and a second amplifying stages, an input filter, and a filter between an output of the first stage and an input of the second stage.

8. The apparatus of claim 7, wherein the controlled gain amplifier further comprises an optical adapter.

9. The apparatus of claim 8, wherein the second amplifying stage has an output load comprising at least one light emitting diode and a current limiting resistor.

10. The apparatus of claim 9, wherein at least one light emitting diode emits a high intensity light.

11. The apparatus of claim 9, wherein at least one light emitting diode emits a broad spectral range "Pure White" light.

12. The apparatus of claim 9, wherein at least one light emitting diode emits a narrow spectral range "Ultra Blue" light.

13. The apparatus of claim 9, wherein the light emitted by at least one light emitting diode is coupled by the optical adapter into a first end of the optical cable.

14. The apparatus of claim 13, wherein an output end of said optical cable is coupled to an input for an end point signal of said data acquisition system.

15. Apparatus for processing an endpoint signal, comprising:

backside gas flow controller producing an output voltage proportional to a value of a flow of backside gas to a space between the support pedestal and the substrate;

an amplifier of the output voltage driving at least one light emitting diode;

an optical cable transmitting a light emitted by said at least one light emitting diode to an end point data acquisition system;

the end point data acquisition system detecting said light to determine the end point of the processing.

16. Apparatus for determining a process end point in a semiconductor substrate processing system, comprising:

a processing chamber having a support pedestal to support a substrate;

a gas source coupled to a flow controller to control a flow of gas to a space between the support pedestal and the substrate, where the flow controller produces an output signal that represents an amount of flow of the gas;

a converter for converting the output signal of the flow controller to an optical signal; and an end point data acquisition system for analyzing the optical signal to determine an end point of a process.

17. The apparatus of claim 16, wherein the processing chamber is a deep trench etch chamber.

* * * * *

UNITED STATES PATENT AND TRADEMARK OFFICE
CERTIFICATE OF CORRECTION

PATENT NO. : 6,837,965 B2
DATED : January 4, 2005
INVENTOR(S) : Gustafson et al.

It is certified that error appears in the above-identified patent and that said Letters Patent is hereby corrected as shown below:

Column 7,
Line 4, after "The" insert -- apparatus --.

Column 8,
Line 3, insert -- a -- before "backside".

Signed and Sealed this

Twelfth Day of July, 2005

JON W. DUDAS
*Director of the United States Patent and Trademark Office*